(12) United States Patent
Li et al.

(10) Patent No.: US 7,601,276 B2
(45) Date of Patent: Oct. 13, 2009

(54) TWO-PHASE SILICATE-BASED YELLOW PHOSPHOR

(75) Inventors: Yi-Qun Li, Danville, CA (US); Yi Dong, Tracy, CA (US); Shifan Cheng, Dublin, CA (US); Dejie Tao, Fremont, CA (US); Ning Wang, Martinez, CA (US)

(73) Assignee: Intematix Corporation, Fremont, CA (US)

( * ) Notice: Subject to any disclaimer, the term of this patent is extended or adjusted under 35 U.S.C. 154(b) by 175 days.

(21) Appl. No.: 11/417,690

(22) Filed: May 3, 2006

(65) Prior Publication Data

US 2006/0261309 A1 Nov. 23, 2006

Related U.S. Application Data

(63) Continuation-in-part of application No. 10/948,764, filed on Sep. 22, 2004, now Pat. No. 7,311,858, which is a continuation-in-part of application No. 10/912,741, filed on Aug. 4, 2004, now Pat. No. 7,267,787, application No. 11/417,690, which is a continuation-in-part of application No. 11/269,953, filed on Nov. 8, 2005, now Pat. No. 7,575,697, which is a continuation-in-part of application No. 11/258,679, filed on Oct. 25, 2005, which is a continuation-in-part of application No. 10/948,764.

(60) Provisional application No. 60/705,693, filed on Aug. 3, 2005.

(51) Int. Cl.
*C09K 11/55* (2006.01)
*C09K 11/59* (2006.01)

(52) U.S. Cl. .................. 252/301.4 F; 252/301.6 F; 313/503; 257/98

(58) Field of Classification Search ........... 252/301.4 F, 252/301.6 F; 313/503; 257/98
See application file for complete search history.

(56) References Cited

U.S. PATENT DOCUMENTS

| 7,267,787 B2 * | 9/2007 | Dong et al. .......... 252/301.4 F |
| 7,311,858 B2 * | 12/2007 | Wang et al. .......... 252/301.4 F |
| 2004/0173807 A1 | 9/2004 | Tian et al. |
| 2006/0028122 A1 | 2/2006 | Wang et al. |

* cited by examiner

*Primary Examiner*—C. Melissa Koslow
(74) *Attorney, Agent, or Firm*—Fliesler Meyer LLP

(57) ABSTRACT

Novel two-phase yellow phosphors are disclosed having a peak emission intensity at wavelengths ranging from about 555 nm to about 580 nm when excited by a radiation source having a wavelength ranging from 220 nm to 530 nm. The present phosphors may be represented by the formula $a[Sr_x(M1)_{1-x}]_z SiO_4 \cdot (1-a)[Sr_y(M2)_{1-y}]_u SiO_5:Eu^{2+}D$, wherein M1 and M2 are at least one of a divalent metal such as Ba, Mg, Ca, and Zn, the values of a, x, y, z and u follow the following relationships: $0.6 \leq a \leq 0.85$; $0.3 \leq x \leq 0.6$; $0.85 \leq y \leq 1$; $1.5 \leq z \leq 2.5$; $2.6 \leq u \leq 3.3$; and Eu and D each range from 0.001 to about 0.5. D is an anion selected from the group consisting of F, Cl, Br, S, and N, and at least some of the D anion replaces oxygen in the host silicate lattice of the phosphor. The present yellow phosphors have applications in high brightness white LED illumination systems, LCD display panels, plasma display panels, and yellow LEDs and illumination systems.

12 Claims, 8 Drawing Sheets

| Chip | CIE x | CIE y | Ra |
|---|---|---|---|
| 447.0nm | 0.311 | 0.304 | 65.6 |
| 452.5nm | 0.310 | 0.308 | 68.5 |
| 460.0nm | 0.308 | 0.304 | 70.9 |

TWO-PHASE SILICATE-BASED YELLOW PHOSPHOR

REFERENCE TO RELATED APPLICATIONS

The present application is a continuation-in-part of application Ser. No. 10/948,764 U.S. Pat. No. 7,311,858, filed Sep. 22, 2004, and titled "Novel silicate-based yellow-green phosphors." application Ser. No. 10/948,764 U.S. Pat. No. 7,311,858 is a continuation-in-part of application Ser. No. 10/912,741 U.S. Pat. No. 7,267,787, filed Aug. 4, 2004, which was titled "Novel phosphor systems for a white light emitting diode (LED). Both application Ser. No. 10/948,764 and application Ser. No. 10/912,741 U.S. Pat. Nos. 7,311,858 and 7,267,787 are hereby incorporated by reference in their entirety. The present application is also a continuation-in-part of U.S. patent application Ser. No. 11/258,679, filed Oct. 25, 2005, titled "Silicate-based orange phosphors and Ser. No. 11/269,953, filed Nov. 8, 2005 now U.S. Pat. No. 7,575,697, titled "Silicate-based green phosphors," each of these applications incorporated herein by reference in their entirety as well. U.S. patent application Ser. No. 11/258,679 claims priority to U.S. provisional application 60/705,693, filed Aug. 3, 2005. U.S. patent application Ser. No. 11/269,953 is a continuation-in-part of U.S. Pat. No. 7,311,858 (which is a continuation-in-part of U.S. Pat. No. 7,267,787) and U.S. patent application Ser. No. 11/258,679.

BACKGROUND OF THE INVENTION

1. Field of the Invention

Embodiments of the present invention are directed in general to a two-phase, silicate-based photoluminescent material. More specifically, the present embodiments are directed to yellow-emitting phosphors comprising two silicate-based phases, the phosphors having applications in high brightness white LED illumination systems, LCD display panels, plasma display panels, and yellow illumination systems.

2. Description of the Related Art

White LEDs are known in the art, and they are relatively recent innovations. It was not until LEDs emitting in the blue/ultraviolet region of the electromagnetic spectrum were developed that it became possible to fabricate a white light illumination source based on an LED. Economically, white LEDs have the potential to replace incandescent light sources (light bulbs), particularly as production costs fall and the technology develops further. In particular, the potential of a white light LED is believed to be superior to that of an incandescent bulb in lifetime, robustness, and efficiency. For example, white light illumination sources based on LEDs are expected to meet industry standards for operation lifetimes of 100,000 hours, and efficiencies of 80 to 90 percent. High brightness LEDs have already made substantial impact on such areas of society as traffic light signals, replacing incandesant bulbs, and so it is not surprising that will soon provide generalized lighting requirements in homes and businesses, as well as other everyday applications.

There are several general approaches to making a white light illumination system based on light emitting phosphors. To date, most white LED commercial products are fabricated based on the approach shown in FIG. 1A, where light from a radiation source contributes to the color output of the white light illumination. Referring to the system 10 of FIG 1A, a radiation source 11 (which may be an LED) emits light 12, 15 in the visible portion of the electromagnetic spectrum. Light 12 and 15 is the same light, but is shown as two separate beams for illustrative purposes. A portion of the light emitted from radiation source 11, light 12, excites a phosphor 13, which is a photoluminescent material capable of emitting light 14 after absorbing energy from the source 11. The light 14 can be a substantially monochromatic color in the yellow region of the spectrum, or it can be a combination of green and red, green and yellow, or yellow and red, etc. Radiation source 11 also emits blue light in the visible that is not absorbed by the phosphor 13; this is the visible blue light 15 shown in FIG. 1A. The visible blue light 15 mixes with the yellow light 14 to provide the desired white illumination 16 shown in the figure.

Figure 1A:
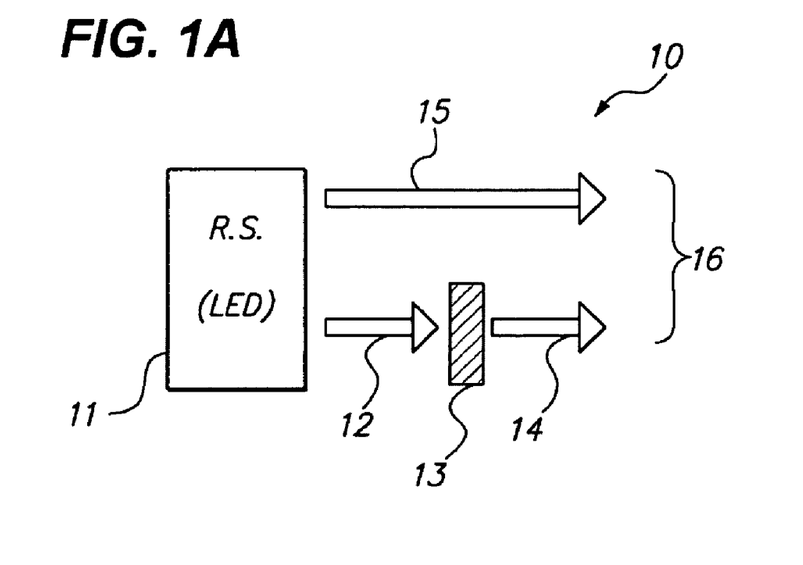
FIG. 1A is a schematic representation of a general scheme for constructing a white light illumination system, the system comprising a radiation source that emits in the visible, and a two-phase, silicate-based phosphor that emits in response to the excitation from the radiation source, wherein the light produced from the system is a mixture of the light from the phosphor and the light from the radiation source.
Figure 1B:
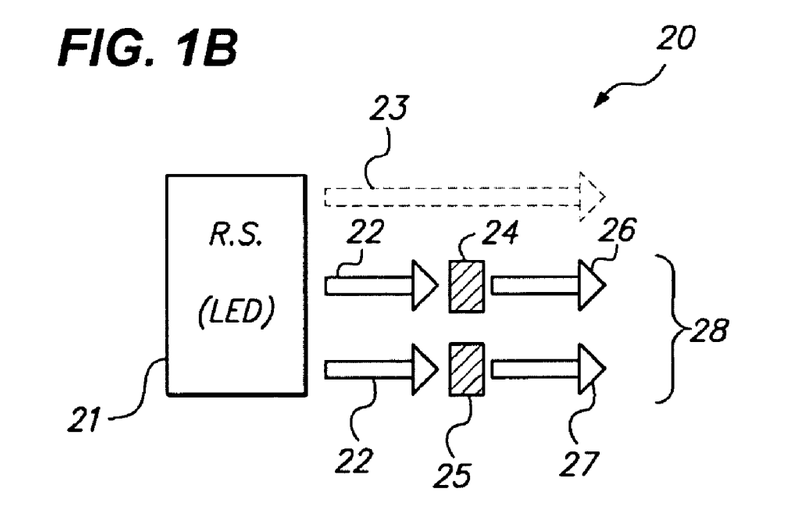
FIG. 1B is a schematic representation of a white light illumination system comprising a radiation source that emits in the non-visible such that the light coming from the radiation source does not contribute substantially to the white light produced by the system, still including a two-phase, silicate-based phosphor.

Alternatively, a newer approach has been to use non-visible radiation sources that emit light in the ultra-violet (UV). This concept is illustrated generally at reference numeral 20 in FIG. 1B, which illustrates an illumination system comprising a radiation source that emits in the non-visible such that the light coming from the radiation source does not contribute substantially to the light produced by the illumination system. Referring to FIG. 1B, substantially non-visible light is emitted from radiation source 21 as light 22, 23. Light 22 has the same characteristics as light 23, but the two different reference numerals have been used to illustrate the following point: light 22 may be used to excite a phosphor, such as phosphor 24 or 25, generating photoemitted light 26 and 27, respectively, but the light 23 emitted from the radiation source 21 which does not impinge on a phosphor does not contribute to the color output 28 from the phosphor(s) because light 23 is substantially invisible to the human eye.

What is needed is an improvement over the silate-based, yellow phosphors of the Prior art where the improvement is manifested at least in part by an equal or greater Conversion efficiency of the blue excitation light to the desired yellow output from the Phosphor. It is also desired for the phosphor to have temperature stability up to 200° C., and an enhanced color rendering. Furthermore, it is critical for the improvement of manufacturing yield to have a yellow phosphor which has a broad and consistent excitation efficiency in a wavelength range from about 400 nm to about 480 nm. The desired yellow phosphor with over all high performance and low cost may be used in conjunction with a blue LED to generate high brightness white light whose color output is stable with temperature, and whose color mixing results in the desired uniform color temperature and color rendering index.

SUMMARY OF THE INVENTION

Embodiments of the present invention are directed to a yellow phosphor having two distinct phases in its compositions, the phases generally represented by the formulas $(M1)_2SiO_4$ and $(M2)_3SiO_5$, where M1 and M2 may each be an alkaline earth metal. The present phosphor has a peak emission intensity in a wavelength ranging from about 555 nm to about 580 nm when excited by a radiation source emitting radiation that ranges from about 220 nm to about 530 nm. The present yellow phosphor is configured to absorb UV to visible light having a wavelength less than about 530 nm, and can be excited at about the consistent emission intensity by light having a wavelength in a wide range from about 360 nm and about 520 nm.

In particular, the yellow phosphors of the present invention comprise a two-phase silicate-based compound having at least one divalent alkaline earth element M1 or M2 that is Mg, Ca, Ba, or Zn in a stoichiometric relationship generally represented by the formula $a[Sr_x(M1)_{1-x}]_2SiO_4 \cdot (1-a)[Sr_y(M2)_{1-y}]_u SiO_5:Eu^{2+}D$, wherein M1 and M2 is at least one of a divalent metal selected from the group consisting of Ba, Mg, Ca, and Zn. The large dot in the middle of the formula indicates that the $SiO_4$ and $SiO_5$ portions of the compound form two distinct phases in the material. The values of a, x, y, z and u follow the following relationships: $0.6 \leq a \leq 0.85$; $0.3 \leq x \leq 0.6$; $0.85 \leq y \leq 1$; $1.5 \leq z \leq 2.5$; and $2.6 \leq u \leq 3.3$. The amounts of europium (Eu) and the anion D each range from about 0.001 to about 0.5. The anion D is selected from the group consisting of F, Cl, Br, S, and N, and it specifically replaces an oxygen anion in the crystal lattice of either of the two phases of the two-phase phosphor. These phosphors are configured to emit visible light having a peak emission wavelength between about 555 nm and 580 nm.

In further embodiments of the present invention, the yellow phosphors may be used in a white LED. Such a white light illumination system comprises a radiation source configured to emit radiation having a wavelength greater than about 280 nm; and a two-phase silicate-based yellow phosphor configured to absorb at least a portion of the radiation from the radiation source and emit light with a peak intensity in a wavelength between 550 nm to about 580 nm. The yellow phosphor has the formula $a[Sr_x(M1)_{1-x}]_zSiO_4 \cdot (1-a)[Sr_y(M2)_{1-y}]_uSiO_5:Eu^{2+}D$, where M1, M2, x, y, z and u are defined as above.

In further embodiments of the present invention, a white LED may include a green phosphor configured to absorb at least a portion of the radiation from the radiation source, and emit light having a peak intensity at a wavelength greater than about 510 nm. Alternatively, the white LED may include a blue phosphor configured to absorb at least a portion of the radiation from the radiation source, and emit light having a peak intensity at wavelengths ranging from about 420 to about 480 nm.

A further embodiment of the present invention is a yellow illumination system comprising a radiation source configured to emit radiation having a wavelength greater than about 280 nm, and a two-phase yellow phosphor configured to absorb at least a portion of the radiation from the radiation source and emit light having a peak intensity at wavelengths ranging from about 555 nm to about 580 nm, wherein the phosphor has the formula $a[Sr_x(M1)_{1-x}]_zSiO_4 \cdot (1-a)[Sr_y(M2)_{1-y}]_uSiO_5:Eu^{2+}D$ where M1 and M2 are at least one of a divalent metal selected from the group consisting of Ba, Mg, Ca, and Zn; $0.6 \leq a \leq 0.85$; $0.3 \leq x \leq 0.6$; $0.85 \leq y \leq 1$; $1.5 \leq z \leq 2.5$; $2.6 \leq u \leq 3.3$; Eu and D each range from about 0.001 to about 0.5; D is at least one anion selected from the group consisting of F, Cl, Br, S, and N; and at least some of the D anion replaces oxygen in the silicate lattice of the phosphor.

A further embodiment of the present invention is a color display panel comprising a radiation source configured to emit radiation having a wavelength greater than about 280 nm, and a two-phase yellow phosphor configured to absorb at least a portion of the radiation from the radiation source and emit light having a peak intensity at wavelengths ranging from about 555 nm to about 580 nm, wherein the phosphor has the formula $a[Sr_x(M1)_{1-x}]_zSiO_4 \cdot (1-a)[Sr_y(M2)_{1-y}]_uSiO_5:Eu^{2+}D$; M1 and M2 are at least one of a divalent metal selected from the group consisting of Ba, Mg, Ca, and Zn; $0.6 \leq a \leq 0.85$; $0.3 \leq x \leq 0.6$; $0.85 \leq y \leq 1$; $1.5 \leq z \leq 2.5$; $2.6 \leq u \leq 3.3$; Eu and D each range from about 0.001 to about 0.5; D is at least one anion selected from the group consisting of F, Cl, Br, S, and N; and at least some of the D anion replaces oxygen in the silicate lattice of the phosphor.

Methods of synthesizing the present yellow phosphors include sol-gel methods, solid reaction methods, and co-precipitation methods. These methods generally involve dissolving the metal and metalloid salts in an aqueous-based solution, and precipitating all of the components together. The precipitate may comprise a solution of the hydroxylates and carboxylates of the metals, mixed at an atomic level. The solution may include a halogen dopant that may replace oxygen on crystalline lattice sites.

An exemplary co-precipitation method comprises:
a) dissolving $Sr(NO_3)_3$, $(M1)(NO_3)_2$ and $(M2)(NO_3)_2$ in water;
b) dissolving $Eu_2O_3$ in nitric acid;
c) dissolving $SrF_2$ in nitric acid;
d) mixing the resulting solutions of steps a), b), and c);
e) adding $(CH_3O)_4Si$ to the resulting solution of step d), and then adding an acid to the mixture to cause precipitation;
f) adjusting the pH of the mixture of step e) to about 9;
g) drying the reaction product of step f), and then calcining the reaction product to decompose the precipitant; and
h) sintering the precipitant of step g) in a reducing atmosphere.

Excitation spectra shows that the present yellow phosphors are efficient at fluorescing when excited at wavelengths ranging from about 200 to 540 nm. The present yellow phosphors offer emission characteristics that have advantages over the phosphors of the prior art, the advantages including both higher luminescent efficiency and better temperature stability, as well as emission consistency over a wide excitation wavelengths. These excitation wavelengths range from about 400 nm to about 500 nm.

The effect of varying the ratio of the alkaline earth metal to the silicon in the host lattice, the type of alkaline earth metal, the effect of the content of the Eu activator, and the role of the halogen dopant are discussed in this disclosure.

DETAILED DESCRIPTION OF THE INVENTION

The novel phosphors of the present invention comprise two-phase, silicate based compounds. They have a utility in a variety of applications, including white light LED systems, yellow colored illumination systems, and components of color display panels, including the component(s) of an RGB (red, green, blue) backlighting system for plasma display panels. The phosphors of the present invention have particular applications in high-power LED packages which operate at higher junction temperature.

Various embodiments of the present two-phase, silicate-based phosphors will be described in the following order: first, a general description of these novel, two phase silicate-based compositions will be given, followed by some details about the crystalline nature of the host silicate lattice, the effect of varying the relative amounts of the alkaline earth metal to the silicon in the lattice, and the effect of varying the relative amounts of different alkaline earth metals. Next, a discussion of the activator divalent europium ($Eu^{2+}$) in at least one phase of the compositions will be provided, in addition to disclosure about the dopant D comprising one or more of the elements F, Cl, Br, S, and N. Particularly important is the fact that at least some of the dopant atoms are located on oxygen atom lattice sites of the host silicate crystal.

Advantages of providing the present two-phase silicate-based systems will be discussed, including, but not limited to, the broad range of excitation energies available to the two (or more) phase phosphor, the enhanced temperature stability of the two (or more) phase phosphor, and the desired emission spectrum that such a two (or more) phase phosphor system is able to provide.

Finally, the use of such two-phase phosphors systems in white LED and color display panels will be covered, including the types of excitation sources that may be used, and an example of other known phosphors that may be used in conjunction with the present two-phase system.

The Novel Multi-phase Silicate-based Phosphor Systems of the Present Embodiments The novel phosphor compositions of the present embodiments have at least two silicate-based phases within the composition, wherein the first phase may have a crystal structure substantially the same as that of $(M1)_2SiO_4$, and a second phase may have a crystal structure substantially the same as that of $(M2)_3SiO_5$. It will be understood by those skilled in the art that these two silicate phases are exemplary; that many other phases are contemplated by the embodiments of this invention, and that it is the relative amounts of the different silicate phases, acting in conjunction with one another, that define the novel attributes.

Here, M1 and M2 each are typically an alkaline earth metal, but M1, M2 may be other elements as well. Thus, M1, M2 are herein defined each as being selected from the group consisting of Sr, Ba, Mg, Ca, and Zn. At least one phase of the composition contains Mg, at levels greater than or equal to about 0.0001 percent by weight.

The present phosphor compositions may be activated by divalent europium ($Eu^{2+}$), although it will be understood by one skilled in the art that divalent europium ($Eu^{2+}$) is not the only activator that may be used to activate a phosphor composition.

At least one of the phases of the composition contains a dopant D that may be a halogen. When the dopant D is a halogen, it is either F, Cl, or Br. This is not to say, however that the dopant D must always be a halogen, or exclusively a halogen; in fact, the dopant D may also include the elements S and N, and may be a combination of a halogen and S and/or N. In some embodiments, at least some of the dopant D atoms contained within the phosphor composition are located on oxygen atom lattice sites of the host silicate crystal, where again, the silicate host lattice includes, but is not limited to, structures such as $SiO_4$, $SiO_5$, $Si_2O_5$, $Si_3O_8$, $SiO_4$, $Si_2O_7$, and $Si_2O_8$, where the amount of the alkaline earth metal substituting for Si depends on its valence.

In one embodiment of the present invention, a novel two-phase phosphor of the present invention may be described in general by the formula $a[Sr_x(M1)_{1-x}]_zSiO_4 \cdot (1-a)[Sr_y(M2)_{1-y}]_uSiO_5:Eu^{2+}D$, where the symbol between the $SiO_4$ portion of the formula and the $SiO_5$ portion of the formula is intended to indicate separate phases. This formula is exemplary in that any two silicate phases may have been chosen. In the exemplary formula displayed above, each of M1 and M2 are at least one of a divalent metal selected from the group consisting of Ba, Mg, Ca, and Zn.

According to the present embodiments the phosphors, regardless of their silicate structure, are not necessarily stoichiometric in their chemical formulas, meaning that there does not necessarily have to be an integer value relationship between the various elements in the formula for the compound. For example, the values of x, y, and z in the formula $a[Sr_x(M1)_{1-x}]_zSiO_4 \cdot (1-a)[Sr_y(M2)_{1-y}]_uSiO_5:Eu^{2+}D$ may follow the following relationships, where $0.6 \leq a \leq 0.85$; $0.3 \leq x \leq 0.6$; $0.85 \leq y \leq 1$; $1.5 \leq z \leq 2.5$; and $2.6 \leq u \leq 3.3$.

The present two phase materials can be synthesized by two approaches: (1) mixing precursors of raw material components in desired compositions of two silicate phases and processing the precursor through liquid reaction or solid reaction, and sintering; (2) processing two phase materials independently and mix the final two phase material through mechanical mixing.

As taught by G. Blasse et al. in Philips Research Reports Vol. 23, No. 1, pp. 1-120, the host lattice in a europium activated phosphor may belong to the system $Me_2SiO_4$, where Me is Sr or Ba, in which case the phosphor has the crystal structure $K_2SO_4$-like, or $Me_3SiO_5$, where Me is either Ca, Sr, or Ba, where the phosphor has the crystal structure (or is related to the crystal structure) $Cs_3CoCl_5$. That the host lattice of the phosphors of the present invention is also crystalline is demonstrated by the exemplary x-ray diffraction patterns shown in FIG. 2A.

Figure 2A:
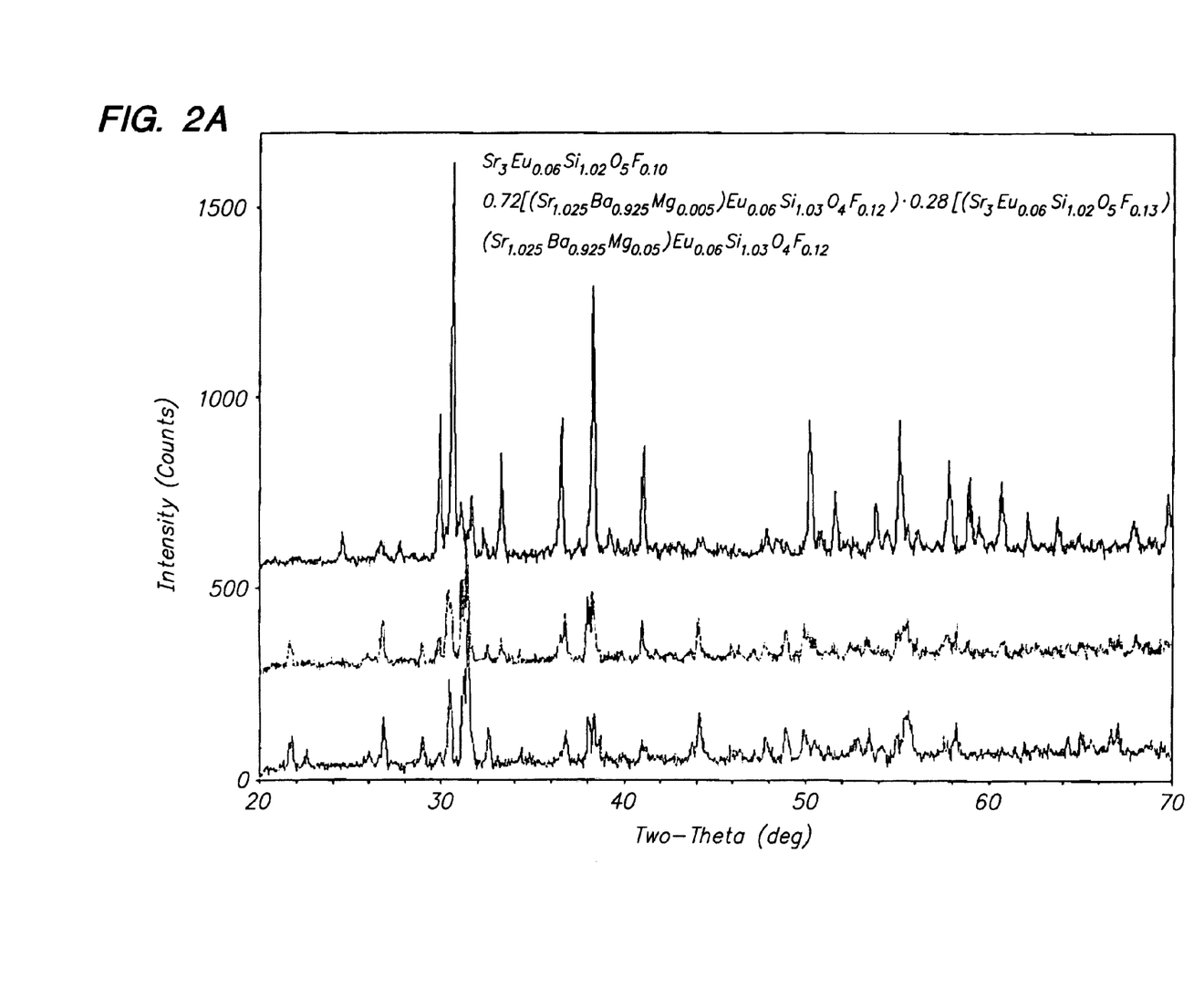
FIG. 2A is an x-ray diffraction pattern of an exemplary two-phase, silicate-based phosphor having the formula $a[Sr_x(M1)_{1-x}]_zSiO_4 \cdot (1-a)[Sr_y(M2)_{1-y}]_uSiO_5:Eu^{2+}D$, provided to illustrate the crystalline nature of the silicate host lattice.

Referring to FIG. 2A, comparison of the x-ray diffraction patterns of an $(M2)_3SiO_5$ type of compound, a two-phase composition of comprising $M_3SiO_5$ and $M_2SiO_4$ type compounds, and an $(M1)_2SiO_4$ type of compound are shown. The x-ray diffraction pattern of the $(M2)_3SiO_5$ type compound is shown as the top curve in FIG. 2A, and the actual compound measured was $Sr_3Eu_{0.6}Si_{1.02}O_5F_{0.13}$. The $(M1)_2SiO_4$ type compound is the bottom curve in FIG. 2, the actual compound being $(Sr_{1.025}Ba_{0.925}Mg_{0.05})Eu_{0.06}Si_{1.03}O_4F_{0.12}$.

The middle curve in FIG. 2A is the x-ray diffraction pattern of the two-phase, silicate-based material, whose general nature may be represented by the formula $(M1)_2SiO_4 \cdot (M2)_3SiO_5$, where the dot indicates a distinction between the two phases of the material. More specifically, the two-phase phosphor may be represented by the formula $a(Sr_xM1_{1-x})_2SiO_4 \cdot (1-a)(Sr_yM2_{1-y})_uSiO_5:Eu^{2+}D$ where in this case the exemplary phosphor was $0.72[(Sr_{1.025}Ba_{0.925}Mg_{0.05})Eu_{0.06}Si_{1.03}O_4F_{0.12}] \cdot 0.28(Sr_3Eu_{0.6}Si_{1.02}O_5F_{0.13})$. Of course, it will be understood by one of ordinary skill in the art that in this case the nomenclature means a=0.72; (1-a)=0.28; M1 includes all three of the alkaline earth metals Sr, Ba, and Mg while M2 is Sr only, and the dopant D is fluorine.

Comparison of the three x-ray diffraction (XRD) patterns in FIG. 2A shows that all three samples are crystalline. While not wishing to be bound by any particular theory, it is believed that the $(M1)_2SiO_4$ may show peaks consistent with the structure of strontium silicate $Sr_2SiO_4$ (orthorhombic crystal structure, space group Pnma), and that the $(M2)_3SiO_5$ may show peaks consistent with the structure of another strontium silicate $Sr_3SiO_5$ (tetragonal crystal structure, space group P4/ncc). The peak positions of the present two-phase phosphor may or may not be shifted slightly along the 2 theta axis due to the barium and/or magnesium substitutions for strontium in the actual phosphor.

Figure 2B:
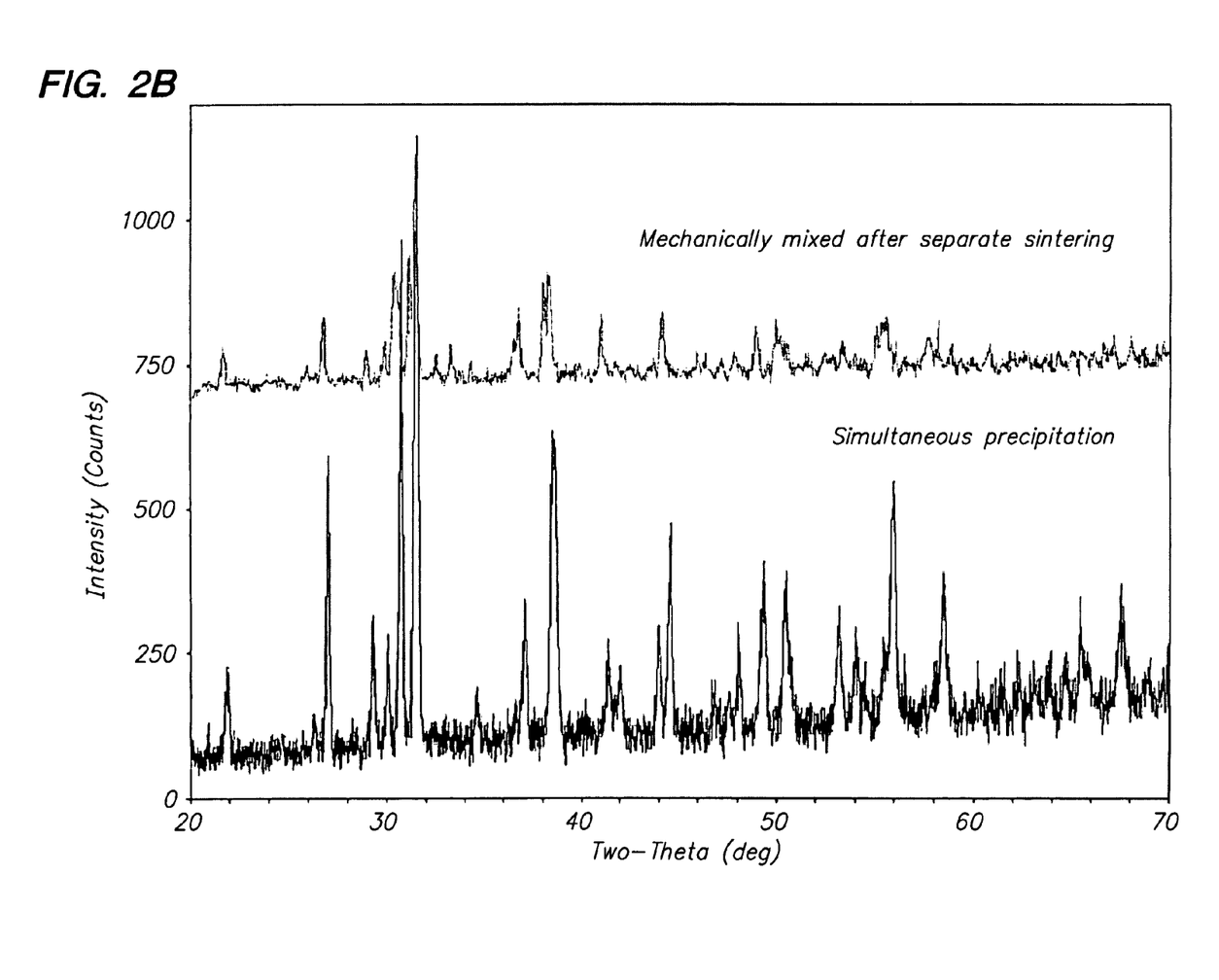
FIG. 2B is an x-ray diffraction pattern of the exemplary two phase phosphor $a[Sr_x(M1)_{1-x}]_zSiO_4 \cdot (1-a)[Sr_y(M2)_{1-y}]_uSiO_5:Eu^{2+}D$ synthesized by two different ways (mechanically mixed after separate sintering and simultaneously precipitated), showing that each synthesis method produces a two phase system.

FIG. 2B shows the x-ray diffraction patterns of an exemplary two-phase phosphor synthesized by two different methods: 1) in one method, each of the phases was co-precipitated, calcined, and sintered separately, and only mixed after each of the two phases had been fully processed; and 2) the two phases were synthesized simultaneously in the liquid phase, and co-precipitated, calcined, and sintered together. The sample prepared by method 1) is labeled "mechanically mixed after separate sintering" in FIG. 2B, and the sample prepared by method 2) is labeled "simultaneous precipitation."

The peaks and their positions are substantially the same for the two samples shown in FIG. 2B, indicating that the two phases $(M1)_2SiO_4$ and $(M2)_3SiO_5$ are formed separately in the liquid phase.

Effect of the Alkaline Earth Components M1 and M2 in the $SiO_4$ and $SiO_5$ Silicate Phases The effect of the alkaline earth components M1 and M2 in the $(M1)_2SiO_4$ and $(M2)_3SiO_5$ silicate phases, respectively, will be discussed in this section.

The optical properties of the $(M1)_2SiO_4$ phase may be controlled, among other methods, by adjusting the ratio of any other elements to the amount of strontium, where M1 is then strontium (Sr) plus another alkaline earth element such as magnesium (Mg), calcium (Ca), barium (Ba), or a transition metal element, such as zinc (Zn), or any combination or combinations thereof. An exemplary data set that puts this embodiment of the inventive concept into place has been illustrated in U.S. patent application Ser. No. 11/269,953, filed Nov. 8, 2005, titled "Silicate-based green phosphors," incorporated herein by reference in its entirety.

The emission spectra of three green phosphors having the formulas $(Sr_{0.2}Ba_{0.8})_2SiO_4:Eu^{2+}F$, which emits at about 522 nm; $(Sr_{0.3}Ba_{0.7})_2SiO_4:Eu^{2+}F$, which emits at about 525 nm; and $(Sr_{0.4}Ba_{0.6})_2SiO_4:Eu^{2+}F$, which emits at about 532 nm, were compared in U.S. patent application Ser. No. 11/269,953 to the emission spectra of a phosphor that emits more in the yellow region of the spectra, that yellow silicate-based phosphor having the formula $(Sr_{0.7}Ba_{0.3})_2SiO_4:Eu^{2+}F$. The yellow phosphor emits at about 540 nm. The phosphors were excited with a blue LED emitting at about 450 nm.

The present inventors have discovered in previous studies that the wavelength position at which the peak emission occurs changes in a $(Sr_{1-x}Ba_x)_2SiO_4$ phosphor system from a green at 500 nm for x=1 (in other words, when the alkali metal content is 100 percent Ba) to a yellow at 580 nm when x=0 (100 percent Sr). The conversion efficiency from the same light source at 450 nm shows a continuous increase when the Ba increases from 0 to about 90%. The peak emission wavelength of 545 nm obtained when the Ba to Sr ratio is 0.3 to 0.7 is close to that of a YAG:Ce peak emission wavelength.

A family of excitation spectra for the same four phosphors $(Sr_{0.2}Ba_{0.8})_2SiO_4:Eu^{2+}F$, $(Sr_{0.3}Ba_{0.7})_2SiO_4:Eu^{2+}F$, $(Sr_{0.4}Ba_{0.6})_2SiO_4:Eu^{2+}F$, and $(Sr_{0.7}Ba_{0.3})_2SiO_4:Eu^{2+}F$ is shown in U.S. patent application Ser. No. 11/269,953. It will be understood by those skilled in the art that an "excitation spectrum" is actually an emission spectrum, where the intensity of the light emitted is measured as a function of the wavelength of the excitation radiation. In other words, a particular wavelength is picked at which to measure the light emitted from the phosphor, and it is the wavelength of the radiation incoming to the phosphor which is scanned. The wavelength that was chosen in this series of experiments is the wavelength at which the most intense emission occurred when the phosphors were excited at 450 nm.

In the particular examples of U.S. patent application Ser. No. 11/269,953, the detector used in the experiment was set to measure the intensity of 522 nm light emitted by the $(Sr_{0.2}Ba_{0.8})_2SiO_4:Eu^{2+}F$ phosphor, since that was the wavelength at which the most intense emission occurred when the $(Sr_{0.2}Ba_{0.8})_2SiO_4:Eu^{2+}F$ phosphor had been excited at 450 nm. Once the detector had been set to 522 nm, the wavelength of the excitation radiation was scanned from about 300 to about 560 nm, and the emission at 522 nm recorded. Likewise, the detector was set to measure the intensity of 525 nm, 532 nm, and 540 nm light for the $(Sr_{0.3}Ba_{0.7})_2SiO_4:Eu^{2+}F$, $(Sr_{0.4}Ba_{0.6})_2SiO_4:Eu^{2+}F$, and $(Sr_{0.7}Ba_{0.3})_2SiO_4:Eu^{2+}F$ phosphors, respectively, and the wavelength of the excitation radiation scanned from about 300 to about 560 nm for each sample.

The data in that example shows that the three green phosphors emitting at 522 nm, 525 nm, and 532 nm are more responsive to the excitation radiation when the excitation radiation has a wavelength less than about 420 nm. Between about 420 and 460 nm, the curves for the 522 and 525 nm green phosphors drop below both the 532 nm green phosphor and the 540 yellow phosphor. None of the four phosphors are responsive to excitation radiation having a wavelength greater than about 500 to 520 nm.

Shortly, it will be shown that unexpected results are obtained with regard to excitation in a two-phase system relative to a single phase system.

Elements other than Ba may be used to substitute for Sr in the silicate host; these alternative elements include Ca and Mg. Calcium substitution of barium or strontium in a Sr—Ba based silicate phosphor system has been shown in general to reduce the emission intensity of a single phase $(M1)_2SiO_4$ system, moving the emission to longer wavelengths when the level of calcium substitution is less than 40 percent. (See U.S. patent application Ser. No. 11/269,953). Large amounts of magnesium substitution for either barium or strontium in Sr—Ba based silicate phosphors in general reduced emission intensity, and moved the emission to shorter wavelengths. However, small amounts of magnesium substitution of barium or strontium (for example, less than 10 percent) enhanced the emission intensity, and shifted the emission to longer wavelengths.

The effect of small amounts of Mg addition to an (M1)$_2$SiO$_4$ silicate-based green phosphor is also shown in U.S. patent application Ser. No. 11/269,953. Disclosed therein is the emission spectra of the phosphors (Sr$_{0.057}$Ba$_{0.4}$Mg$_{0.025}$)$_2$SiO$_4$:Eu$^{2+}$F and (Sr$_{0.057}$Ba$_{0.4}$Mg$_{0.025}$)$_2$SiO$_4$:Eu$^{2+}$F under 450 nm excitation, measured and compared to the emission of a phosphor containing substantially no Mg. The "control" phosphor having no Mg was represented by the formula (Sr$_{0.6}$Ba$_{0.4}$)$_2$SiO$_4$:Eu$^{2+}$F. The purpose of choosing this series of compositions had been to show the effect of substituting Mg first for Sr, leaving the Ba concentration substantially constant, and then for Ba, leaving the Sr concentration substantially constant.

Mg addition increased the intensity of the emission. Looking at the peak of the emission intensity at about 540 nm for all three phosphors, the phosphor demonstrating the lowest emission intensity of the three was the control phosphor, (Sr$_{0.6}$Ba$_{0.4}$)$_2$SiO$_4$:Eu$^{2+}$F. The phosphor that substituted Mg for Ba demonstrated an increase in emission intensity of about 6 to 7 percent relative to the control phosphor, and the phosphor that substituted Mg for Sr demonstrated an increase in emission intensity of about 10 percent relative to the control phosphor. It was also observed that Mg inclusion shifted the wavelength at which peak emission occurs to longer wavelengths (i.e., slightly towards yellow and away from green), and this effect was more noticeable when Mg substituted for Ba than when Mg substituted for Sr.

It is reiterated that these effects were observed for a single phase, (M1)$_2$SiO$_4$ system.

Analogous optical observations may be made for the single phase, (M2)$_3$SiO5 system, and compared to single phase (M1)$_2$SiO$_4$ observations. These have been discussed in U.S. patent application Ser. No. 11/258,679, filed Oct. 25, 2005, titled "Silicate-based orange phosphors," incorporated herein by reference in its entirety, which has reported emission spectra for the individual phases Sr$_3$SiO$_5$, (Ba$_{0.1}$Sr$_{0.9}$)$_3$SiO$_5$, and (Ba$_{0.075}$Mg$_{0.025}$Sr$_{0.9}$)$_3$SiO$_5$. The phosphors demonstrating the greatest emission intensity were the phosphors (Ba$_{0.1}$Sr$_{0.9}$)$_3$SiO$_5$, and (Sr$_{0.97}$Eu$_{0.03}$)$_3$SiO$_5$:F. These phosphors demonstrate not only the highest intensity emission of the five phosphors depicted, but also the some of the longest peak emission wavelengths in the graph, ranging from about 585 to 600 nm, well within the orange region of the electromagnetic spectrum. Of the exemplary phosphors of the present invention, the phosphor showing the shortest wavelength emission was (Ba$_{0.075}$Mg$_{0.025}$Sr$_{0.9}$Eu$_{0.03}$)$_3$SiO$_5$:F, with a peak wavelength emission slightly less than 580 nm.

Examples of varying the ratio of the Sr (or Ba, Ca, etc.) to Si content in a series of exemplary phosphors having the formula (Sr$_{0.97}$Eu$_{0.03}$)$_y$SiO$_5$ are also shown in U.S. patent application Ser. No. 11/258,679. The data showed that a maximum in the emission intensity was found when the ratio of Sr to Si was about 3.1, with a secondary maximum in intensity found at about 2.8. The point of that graph was to show that it was not necessary to stick rigidly to the stoichiometry (M2)$_3$SiO$_5$ in a single phase system (again, M2 is the amount of Sr, Ba, Ca, Eu, etc.), where the ratio of the alkaline earth metal or other element M to the silicon is fixed at a value of about 3.0. In fact, there were advantages in varying this ratio relative to traditional values for the purposes of enhancing emission intensity.

Varying the nature (meaning identity) and the content of the alkaline earth metal in the (M2)$_3$SiO$_5$ orange phosphors of U.S. patent application Ser. No. 11/258,679 had an effect on both the peak value of the emission intensity and the emission wavelength. There, the alkaline earth metal M was selected from the group consisting of magnesium (Mg), strontium (Sr), calcium (Ca), and barium (Ba) in the series (M$_x$Sr$_{1-x}$)$_{2.91}$Eu$_{0.09}$SiO$_5$.

The effect of the inclusion of the two different alkaline earth metals Ca and Mg was also demonstrated in U.S. patent application Ser. No. 11/258,679, where emission spectra data of a series of phosphors having the formula (Ca$_x$Sr$_{1-x}$)$_{2.91}$Eu$_{0.09}$SiO$_5$ was shown, the samples having values of x equal to 0.0, 0.5, and 1.0. The data was also shown normalizing the x=1 and x=0.5 results such that all three peaks have essentially the same height as the peak for the x=0 composition. In that series, the composition with the intermediary ratio of Ca to Sr (in other words, the composition with substantially equal amounts of Ca and Sr) demonstrated the longest peak wavelength emission at about 605 to 610 nm. This is more toward the red, and away from yellow, than either of the other two members of the series. The composition comprising mostly calcium (x=1) showed the shortest peak emission wavelength at about 510 nm, which is a color towards the green end of yellow. The composition having all strontium and no calcium was in the middle of the distribution, with a peak wavelength emission at about 590 nm.

Again referring to U.S. patent application Ser. No. 11/258,679, it was observed that substitution of magnesium for strontium in the composition (Mg$_x$Sr$_{1-x}$)$_{2.91}$Eu$_{0.09}$SiO$_5$ decreased the intensity of the emission, as well as shifting the wavelength of the peak emission to shorter wavelengths. This was the case for both situations where the phosphor has been excited at a 403 nm and at 450 nm. The composition comprising entirely strontium as the alkaline earth metal component (x=0) emitted at the longest wavelength for both excitation wavelengths, and again this emission occurred at about 590 nm. The substitution of a small amount of magnesium for strontium (x=0.2) reduces the intensity of the emission significantly, but without changing the wavelength of the emission substantially.

Substitution of still further amounts of magnesium for strontium to initially a level of x=0.30, followed by further reduction to a level of x=0.35, increased the emission intensity from that of the x=0.2 composition, albeit not to a full recovery of the intensity which had been demonstrated for zero levels of magnesium. At this point in the series of magnesium substitution for strontium (the level x=3.5), the second highest emission intensity in the series was observed. From this concentration on, further substitution of magnesium for strontium (to values of x=0.4 and x=0.5, respectively) decreased the intensity, at first only to a small degree, and then rather substantially. The peak emission wavelength of the compositions x=0.3, 0.35 and 0.4 x=0.5 ranged from about 530 to 560 nm.

The Effect of the Content of the Eu Activator in Single Phase Systems

The optimum activator concentration in a composition Me$_3$SiO$_5$ has been reported to be a few atomic per cent of europium, relative to the alkaline earth metals Me (where Me is Ca, Sr, and Ba; see the article by G. Blasse et al. in Philips Research Reports, Vol. 23, No. 1, 1968), and similar results were found are reported in this disclosure. The effect of varying the content of the europium activator in a single phase silicate-based composition, represented by the formula (Sr$_{1-x}$Eu$_x$)$_3$SiO$_5$, as been reported in U.S. patent application Ser. No. 11/258,679. The maximum emission intensity was found for the composition having an Eu concentration of about 0.02, with the next most intense composition being x=0.03.

In the present two-phase silicate-based compositions represented in general by the formula $[Sr_x(M1)_{1-x})]_zSiO_4.(1-a)[Sr_y(M2)_{1-y}]_uSiO_5:Eu^{2+}D$, the level of the europium activator in each phase is not specified, but may in general range from about 0.01 to about 0.1, where the $Eu^{2+}$ replaces M1 and M2 in the two-phase composition.

The Role of the Dopant Anion D

The effect of including a dopant anion D into the present two-phase compositions, where the amount of D in the formula $[Sr_x(M1)_{1-x})]_zSiO_4.(1-a)[Sr_y(M2)1_{-y}]_uSiO_5:Eu^{2+}D$ is not specifically specified, will now be discussed. In this embodiment, at least one of the phases of the composition contains a dopant D selected from the group consisting of F, Cl, Br, S, and N, wherein at least some of the dopant atoms are located on oxygen atom lattice sites of the host silicate crystal.

An example of the role of fluorine (F) in a single phase system is given in U.S. patent application Ser. No. 11/258, 679, which showed a graph of the intensity of the emission of the phosphor $(Sr_{0.97}Eu_{0.03})_3SiO_5F_{6z}$, as a function of the fluorine (F) concentration. z ranged from 0 to about 0.1. Here, it was shown that an F concentration ranging from about 0.03 to 0.06 in a $(M2)_3SiO_5$ type single phase silicate-based system offered a substantial enhancement in emission intensity.

In the present two-phase embodiments, a halogen such as fluorine may be added to either of the two phases in the form of a $NH_4F$ dopant. The present inventors have found that when the $NH_4F$ dopant amount is very small (about 1%), the position of the peak emission is located at shorter wavelengths, and as more $NH_4F$ is added, the wavelength increases with dopant amount. The luminescence of the Eu doped phosphor is due to the presence of the $Eu^{2+}$ in the compound, which undergoes an electronic transition from $4f^65d^1$ to $4f^7$. The wavelength positions of the emission bands depend very much on the host's material or crystal structure, changing from the near-UV to the red region of the spectrum. This dependence is interpreted as due to the crystal field splitting of the 5d level. With increasing crystal field strength, the emission bands shift to longer wavelength. The luminescence peak energy of the 5d-4f transition is affected most by crystal parameters denoting electron-electron repulsion; in other word, the distance between $Eu^{2+}$ cation and surrounding anions, and the average distance to distant cations and anions.

In the presence of small amounts of $NH_4F$, the fluorine anion dopant functions predominantly as a flux during sintering processing. Generally, a flux improves sintering processing in one of two ways: the first is to promote crystal growth with the liquid sintering mechanism, and the second is to absorb and collect the impurities from the crystal grains and improve the phase purity of the sintered materials. In one embodiment of the present invention, the host phosphor is $(Sr_{1-x}Ba_x)_3SiO_5$. Both Sr and Ba are very large cations. There may be present smaller cations such as Mg and Ca, which may be considered to be impurities. Therefore, further purification of host lattice will lead to more perfect symmetric crystal lattice and a larger distance between cations and anions, with a result of a weakening of the crystal field strength. This is the reason that small amount doping of $NH_4F$ moves the emission peak to shorter wavelength. The emission intensity increases with this small amount of F doping attributes to a higher quality crystal with fewer defects.

When the amounts of $NH_4F$ are increased even further, some of the $F^-$ anions will replace $O^{2-}$ anions, and become incorporated into the lattice. Cation vacancies will be created in order to maintain an electrical charge neutrality. Since the vacancies in the cation positions reduce the average distance between cations and anions, the crystal field strength will be increased. Therefore, the peak of the emission curves will move to longer wavelength as the $NH_4F$ content increases due to the increased number of cation vacancies. The emission wavelength is directly related to the energy gap between ground and excitation states which is determined only by the crystal field strength. The result of emission wavelength increases with the fluorine and chlorine is strong evidence of fluorine or chlorine incorporating into the host lattice, most likely in substitute of oxygen sites. On the other hand, the addition of a phosphate ion does not substantially change the emission wavelength, as expected. This is again evidence that phosphate acts as a cation, will not replace oxygen, and thus will not be easily incorporated into the lattice to change the host material's crystal field strength. This is particularly true of the crystal field surrounding the $Eu^{2+}$ ions, which consist essentially of oxygen sites. The improvement in the emission intensity gained by adding $NH_4H_2PO_4$ indicates that it works a flux agent as discussed above.

Optical Properties of a Two-phase, Silicate-based System

Figure 3:
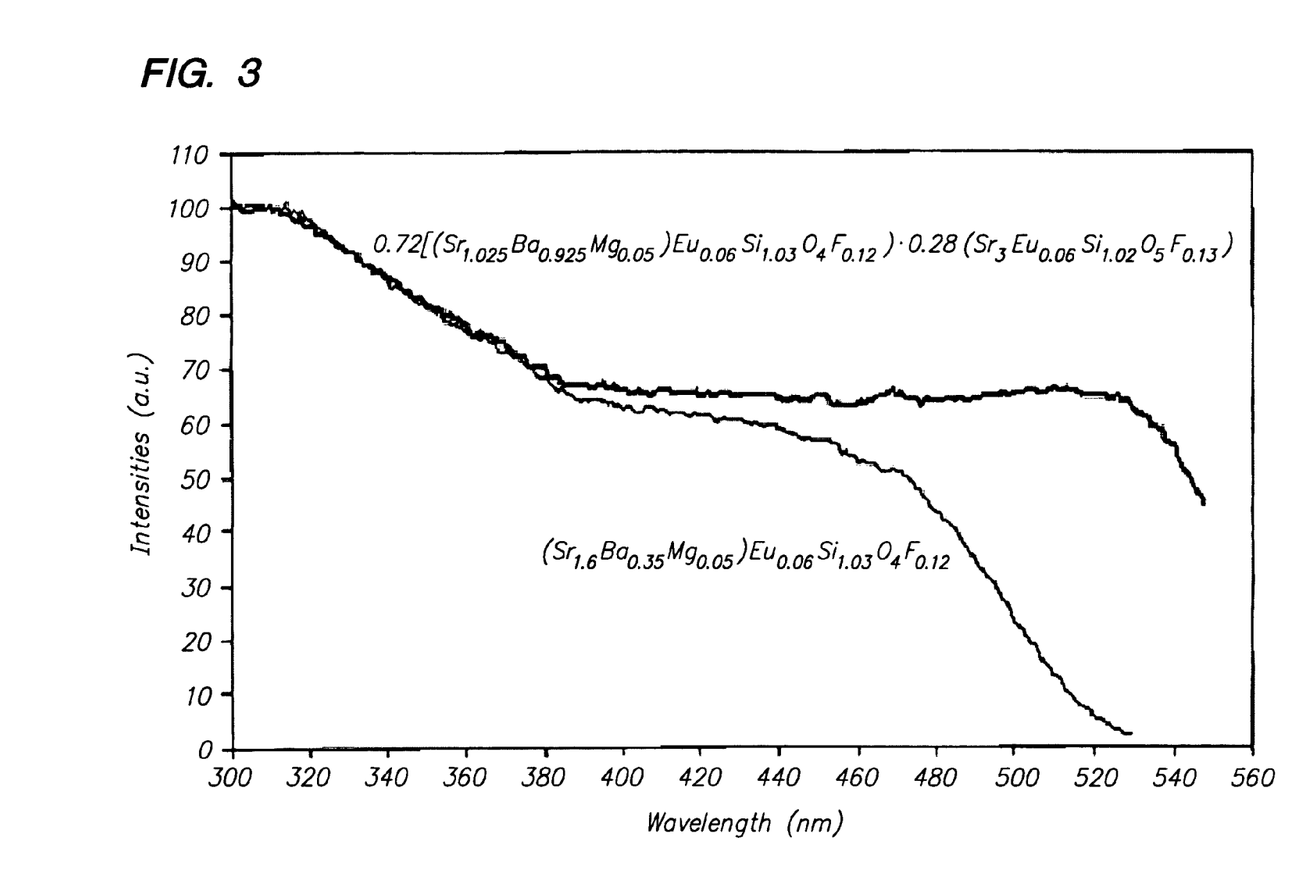
FIG. 3 is an excitation spectrum of an exemplary two-phase system represented by the general formula formula $(M1)_2SiO_4 \cdot M(2)_3SiO_5$, shown in comparison to a single phase system $(M1)_2SiO_4$, showing that the two-phase system may be configured such that the emission varies by no more than 10 percent, and in some embodiments by no more than 5 percent, over an excitation wavelength range greater than about 340 nm.
Figure 4:
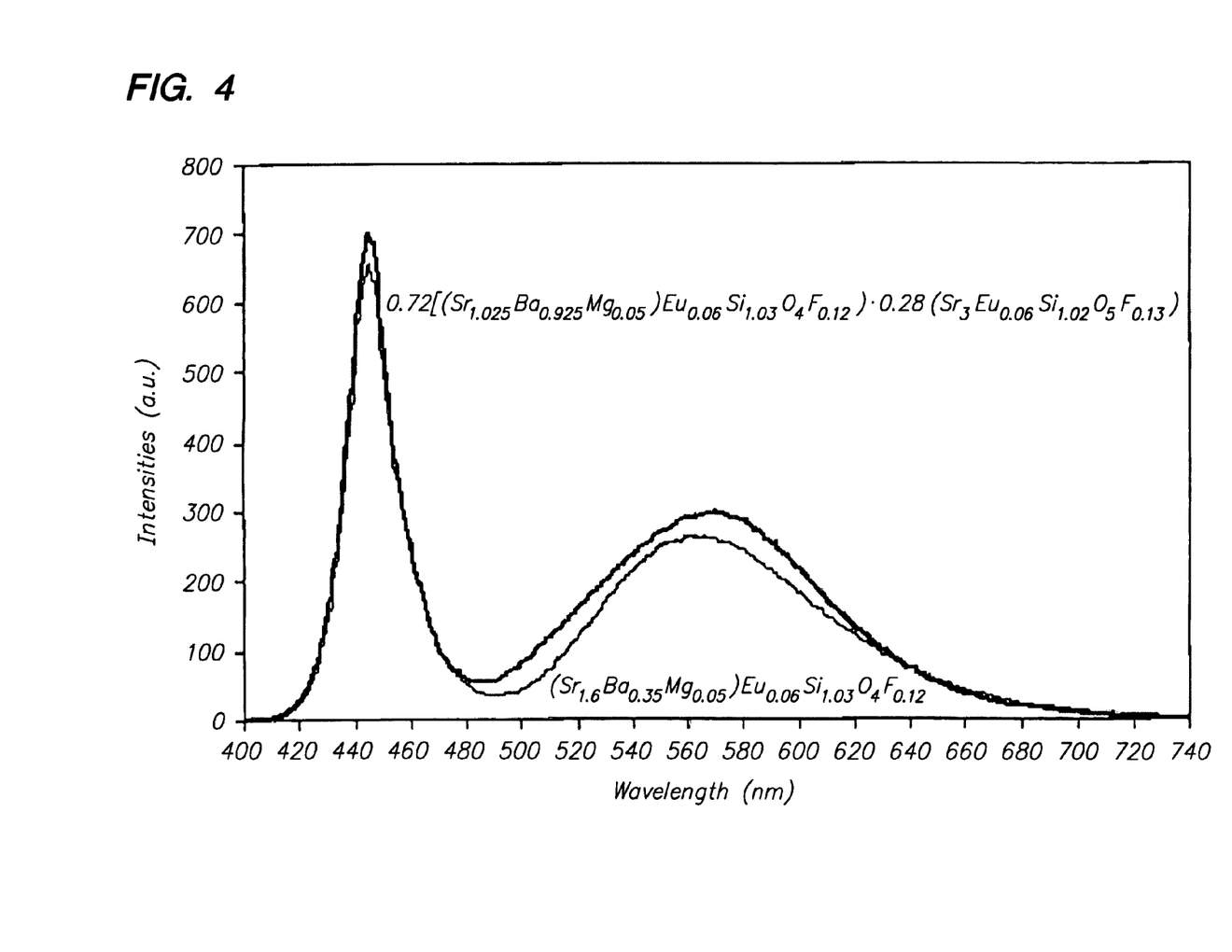
FIG. 4 is a graph of emission spectra of the blue chip providing the excitation, and of the normalized emission of the present yellow phosphor $a(Sr_xM1_{1-x})_zSiO_4 \cdot (1-a)(Sr_yM2_{1-y})_uSiO_5:Eu^{2+}D$ in comparison with a prior art $(SrBaMg)_2SiO_4$ packaged as white LEDs; the yellow emission of the present two-phase yellow phosphor showing a broader emission in the green region of the electromagnetic spectrum.
Figure 5A:
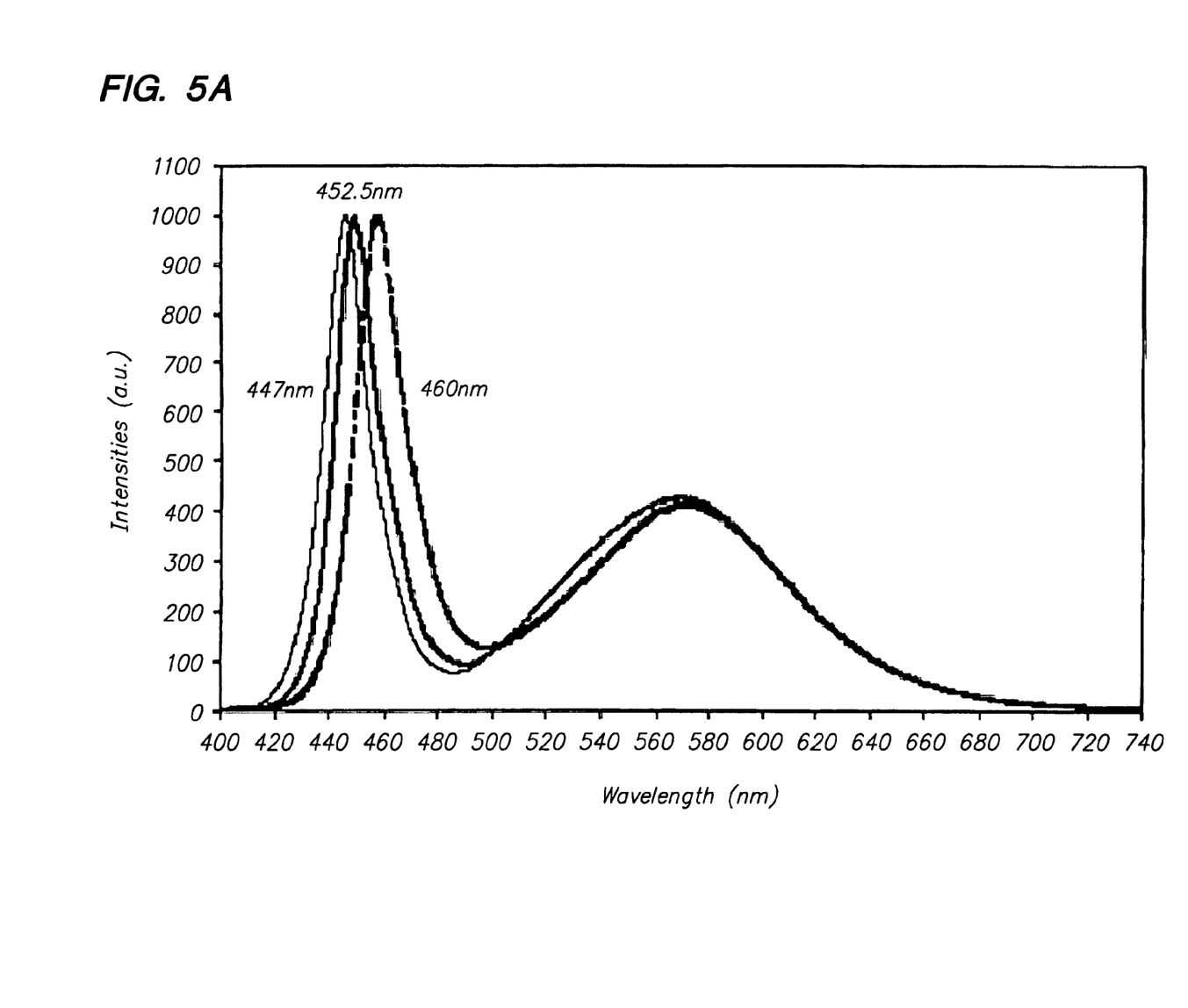
FIG. 5A is a plot of three emission spectra of the present yellow phosphor $a(Sr_xM1_{1-x})_zSiO_4 \cdot (1-a)(Sr_yM2_{1-y})_uSiO_5:Eu^{2+}D$ packaged in three different white LEDs with three different wavelength of blue chip excitation (445 nm, 447.5 nm, and 450 nm), showing that brightness and CIE are substantially unaffected by excitation wavelength.
Figure 5B:
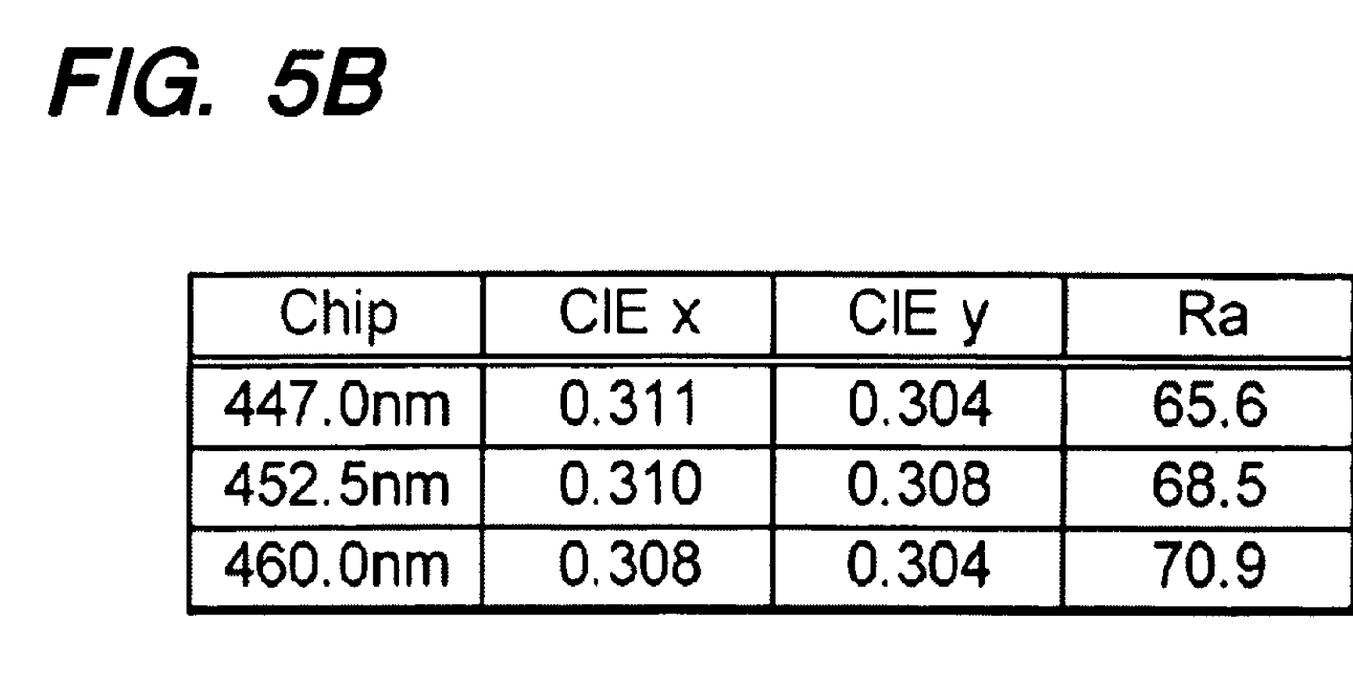
FIG. 5B is a table showing quantifying the CIE x and y coordinates and Ra values of the data from FIG. 5A.
Figure 6:
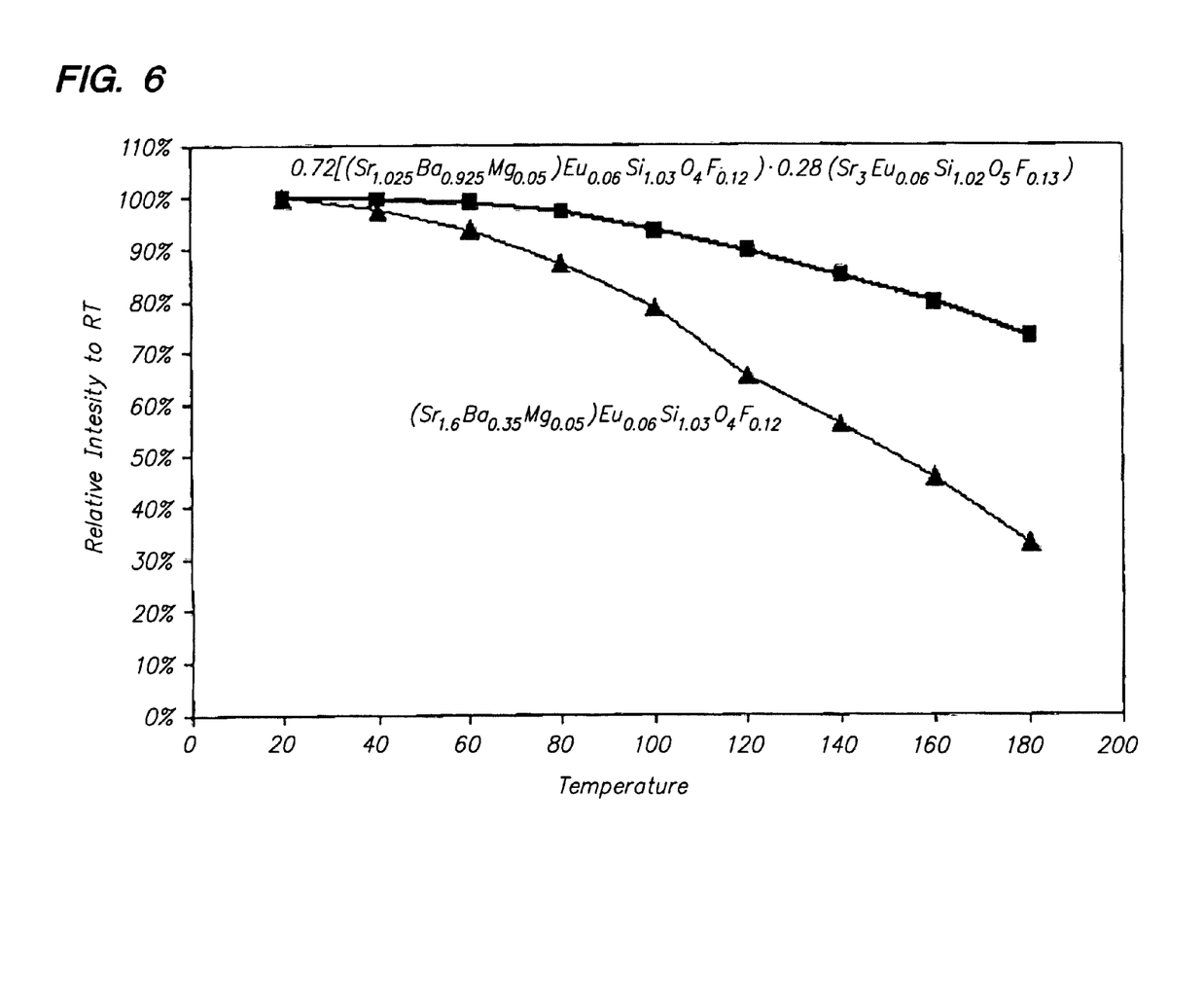
FIG. 6 is a graph showing the temperature stability of an exemplary two-phase, silicate-based system showing emission intensities at temperatures ranging from 20° C. to 180° C., plotted relative to the emission intensity at room temperature (20° C.), with data from a single phase phosphor shown for comparison.

The optical properties of an exemplary two-phase, silicate-based phosphor system are shown in FIGS. 3-6. FIG. 3 is an excitation spectrum of a two-phase system shown in comparison with a one-phase phosphor, and FIG. 4 is an emission spectrum of the same two compounds. FIG. 5A is an emission spectrum of a two-phase system under three different excitation wavelengths, and FIG. 5B is a table of the CIE coordinates and Ra of the two-phase phosphor system of FIG. 5A. FIG. 6 shows temperature stability, defined as emission intensity as a function of temperature. Each of these figures will be discussed in turn.

FIG. 3 is the excitation spectrum of an exemplary two-phase silicate phosphor represented in general by the formula the two-phase phosphor may be represented by the formula $a(Sr_xM1_{1-x})_zSiO_4.(1-a)(Sr_yM2_{1-y})_uSiO_5:Eu^{2+}D$, and the particular phosphor being $0.72[(Sr_{1.025}Ba_{0.925}Mg_{0.05})Eu_{0.06}Si_{1.03}O_4F_{0.12}].0.28(Sr_3Eu_{0.6}Si_{1.02}O_5F_{0.13})$. Shown for comparison is the one-phase phosphor $(Sr_{1.025}Ba_{0.925}Mg_{0.05})Eu_{0.06}Si_{1.03}O_4F_{0.12}$.

What is unexpected in FIG. 3 is the extraordinary manner in which the emission intensity of the two-phase system is constant over a very long range of excitation wavelengths. The two-phase compound shows an emission intensity that varies by no more than about 10 percent over an excitation wavelength range that is greater than about 140 nm. In some embodiments the emission intensity varies by no more than about 5 percent over the excitation wavelength range that is equal to about 140 nm. In this case, the 140 nm range of excitation wavelengths is from about 380 to about 520 nm.

For comparison, the one-phase system generally represented by the $(M1)_2SiO_4$, and in particular the compound being $(Sr_{1.025}Ba_{0.925}Mg_{0.05})Eu_{0.06}Si_{1.03}O_4F_{0.12}$, shows nearly a 100 percent decrease in luminescence over this same 360 to 520 wavelength range.

The advantages of having such a level curve is that a two-phase phosphor system may be excited by a variety of excitation sources, and yet still emit a constant amount of luminescence. This gives the optical engineer using the present two-phase silicate-based compound an extraordinary amount of latitude in choosing the radiation source, and in designing the overall system.

Of course, in other embodiments, a constant emission over such a wide range of excitation wavelengths may not be necessary; in other words, it may only be necessary to provide a constant emission over the more narrow range of about 80 nm (say, for example, from 380 to 460 nm. Shown in FIG. 3 is that the present, two-phase silicate-based compound 0.72 [$(Sr_{1.025}Ba_{0.925}Mg_{0.05})Eu_{0.06}Si_{1.03}O_4F_{0.12}$].0.28 ($Sr_3Eu_{0.6}Si_{1.02}O_5F_{0.13}$) further demonstrates a variation of less than about 10 percent in some embodiments, and less than about 5 percent in other embodiments, over this 80 nm excitation range, whereas the ($Sr_{1.025}Ba_{0.925}Mg_{0.05}$)$Eu_{0.06}Si_{1.03}O_4F_{0.12}$ single phase phosphor shows a decrease of about 50 percent.

A comparison of the emission spectra of a single phase silicate-based compound and a two-phase silicate based system is shown in FIG. 4. Again, the exemplary $(M1)_2SiO_4$ phosphor is ($Sr_{1.025}Ba_{0.925}Mg_{0.05}$)$Eu_{0.06}Si_{1.03}O_4F_{0.12}$, and the exemplary $(M1)_2SiO_4.M(2)_3SiO_5$ two phase system is 0.72[($Sr_{1.025}Ba_{0.925}Mg_{0.05}$)$Eu_{0.06}Si_{1.03}O_4F_{0.12}$].0.28 ($Sr_3Eu_{0.6}Si_{1.02}O_5F_{0.13}$). The excitation wavelength of both the single phase phosphor and two-phase system was about 440 nm, and the data has been normalized to more easily compare the widths of the curves. FIG. 4 shows that the two phase system demonstrates a broader range of emission than does the single phase system.

That the two-phase system is substantially impervious to excitation wavelength is shown in a different way in FIG. 5A. Here, the $(M1)_2SiO_4.M(2)_3SiO_5$ two phase system 0.72 [($Sr_{1.025}Ba_{0.925}Mg_{0.05}$)$Eu_{0.06}Si_{1.03}O_4F_{0.12}$].0.28 ($Sr_3Eu_{0.6}Si_{1.02}O_5F_{0.13}$) was excited by three different radiation sources having peak excitation wavelengths at 447 nm, 452.5 nm, and 460 nm. FIG. 5 shows that the emission profiles between 500 and 660 nm were substantially the same, as was both the peak emission intensity, and the wavelength at which the peak emission occurred (about 575 nm).

A quantitative evaluation of the emission profile is given in FIG. 5B. Here, the CIE x and y coordinates of the profile excited by the 447.0 nm blue chip were 0.311 and 0.304, respectively, with an Ra value of 65.6. The CIE x and y coordinates of the profile excited by the 452.5 nm blue chip were 0.310 and 0.308, respectively, with an Ra value of 68.5. The CIE x and y coordinates of the profile excited by the 460.0 nm blue chip were 0.308 and 0.304, respectively, with an Ra value of 70.9.

Temperature Stability

An additional unexpected and beneficial attribute of the present two-phase system is its remarkable temperature stability over a wide range of temperatures. Plotted in FIG. 6 is the emission intensity of a two-phase, silicate-based phosphor composition represented by the general formula $(M1)_2SiO_4.M(2)_3SiO_5$, the emission measured over a temperature range of 20° C. to 180° C., and graphed in a manner such that the emission intensity at any one particular temperature is plotted relative to the intensity that composition or phosphor showed at room temperature (approximately 20° C.). Shown for comparison is a similar measurement and analysis for the single phase phosphor $(M1)_2SiO_4$. The exemplary single phase phosphor was ($Sr_{1.025}Ba_{0.925}Mg_{0.05}$)$Eu_{0.06}Si_{1.03}O_4F_{0.12}$, and the exemplary two phase system was 0.72[($Sr_{1.025}Ba_{0.925}Mg_{0.05}$)$Eu_{0.06}Si_{1.03}O_4F_{0.12}$].0.28 ($Sr_3Eu_{0.6}Si_{1.02}O_5F_{0.13}$).

The results show that for the present two-phase system, the composition may be configured to emit, at temperatures greater than about 100° C., light having an intensity that is equal to or greater than about 90 percent of the light intensity that is emitted at 20° C. At temperatures greater than about 120° C., light is emitted with an intensity that is equal to or greater than about 90 percent of the light intensity that is emitted at 20° C. Similarly, at temperatures greater than about 140° C., light is emitted with an intensity that is equal to or greater than about 80 percent of the light intensity that is emitted at 20° C.; at temperatures greater than about 160° C., light is emitted with an intensity that is equal to or greater than about 80 percent of the light intensity that is emitted at 20° C.; and at temperatures greater than about 180° C., light is emitted with an intensity that is equal to or greater than about 70 percent of the light intensity that is emitted at 20° C.

This is to be compared to the single phase system, where at temperatures of 100° C., 120° C., 140° C., 160° C., and 180° C., light is emitted that has an intensity of about 80 percent, 65 percent, 55 percent, 45 percent, and 30 percent, respectively, of the light that was emitted at 20° C.

Clearly the two-phase system offers superior temperature stability over a single phase system. The significance to the marketplace of the thermal stability of a phosphor (and the illumination system of which is a part) is the following: general lighting and automotive applications usually require an operating temperature of more than about 100° C. Additionally, the junction temperature at the surface of an LED chip increases as the input current to the device increases. Higher brightness may be achieved by increasing the driving current, but thermal management of the LED package has to be given careful consideration. The junction temperature of a LED with a power higher than 1 W is specified at about 120° C., and it is believed future applications will require operating temperatures up to about 200° C. at the device junction.

Production of White Light Illumination

The white light illumination that may be produced using the inventive, two-phase yellow phosphor will be discussed next. This section begins with a description of illustrative blue LEDs that may be used to excite the inventive two-phase yellow phosphor. That the present yellow phosphors are capable of absorbing, and can be excited by, light over a large range of wavelengths, including the blue portion of the visible, is demonstrated by the excitation spectra of FIG. 3. According to the general scheme of FIG. 1, light from the inventive yellow phosphor may be combined with light from the blue LED to make white illumination. Alternatively, light from the inventive yellow phosphor (excited by light from a non-visible UV excitation source) may be combined with light from another phosphor, such as, for example, a blue, green, orange, or red phosphor. Thus, the color rendering of the white light may be adjusted with the inclusion of other phosphors in the system.

It is important to note that current white LED manufacturing cannot precisely control the CIE output of the final product due to the variation in wavelength of the output of the blue chip (radiation source) used to provide excitation to the phosphor. Currently, excitation sources in the form of blue light emitting semiconductor chips are categorized by 2.5 nm increments in a range from about 445 nm to 470 nm. Substantially all existing yellow phosphors have a certain variation of emission intensity when the wavelength of a radiation source changes, even if that variation is only about 2.5 nm. YAG materials have an emission maximum when excited at a radiation wavelength of about 460 nm, and emission efficiency will decrease when the excitation wavelength is varied to either side of the 460 nm value. Silicate-based single phase phosphors have an emission efficiency that dramatically decreases when the excitation wavelength is increased from 450 nm, as shown in FIG. 3.

The CIE value of the white LED light produced from a system comprising the blue chip radiation source and a yellow phosphor depends on the emission ratio of the blue chip and the yellow phosphor. Even if the power provided to the radiation source (the blue semiconductor chip) and the amount of the yellow phosphor present in the device are precisely controlled, the final CIE value varies as the wavelength of the light emitted by the blue chip is varied. The data showed in FIGS. 4 and 5A demonstrate that the CIE value of a white LED using the present two-phase yellow phosphor will not affected by the change in chip wavelength from 447 nm to 460 nm. This advantage will be dramatically beneficial to the improvement of the control of the CIE value in white LED production using the present two-phase yellow phosphor and blue semiconductor excitation source.

The Blue LED Radiation Source

In certain embodiments, the blue light emitting LED emits light having a main emission peak in the wavelength range greater than or equal to about 400 nm, and less than or equal to about 520 nm. This light serves two purposes: 1) it provides the excitation radiation to the phosphor system, and 2) it provides blue light which, when combined with the light emitted from the phosphor system, makes up the white light of the white light illumination.

In certain embodiments, the blue LED emits light greater than or equal to about 420 nm, and less than or equal to about 500 nm. In yet another embodiment, the blue LED emits light greater than or equal to about 430 and less than or equal to about 480 nm. The blue LED wavelength may be about 450 nm.

The blue light emitting device of the present embodiments is herein described generically as a "blue LED," but it will be understood by those skilled in the art that the blue light emitting device may be at least one of (wherein it is contemplated to have several operating simultaneously) a blue light emitting diode, a laser diode, a surface emitting laser diode, a resonant cavity light emitting diode, an inorganic electroluminescence device and an organic electroluminescence device. If the blue light emitting device is an inorganic device, it may be a semiconductor selected from the group consisting of a gallium nitride based compound semiconductor, a zinc selenide semiconductor and a zinc oxide semiconductor.

FIG. 3 is an excitation spectrum of the present yellow phosphors, showing that these novel phosphors are capable of absorbing radiating over a range of about 220 to 560 nm, and most importantly it has a constant emission intensity at 565 nm when the excitation wavelength varies from about 400 nm to about 530 nm.

Example of the Use of the Present, Two-phase Yellow Phosphor

In one embodiment of the present invention, a white illumination device can be constructed using a GaN based blue LED having a emission peak wavelength ranging about 430 nm to 480 nm, in combination with the inventive yellow phosphor with an emission peak wavelength about 550 to 580 nm range. It will be understood by those skilled in the art that light emitted from the present yellow phosphors may be combined with light from a visible blue radiation source, or light from a blue, green, or red phosphor, among other phosphors.

An example of the white light that may be obtained from a combination of the present yellow phosphors and the blue radiation source or phosphor described in the above-mentioned application is shown in FIG. 2. This white light was produced by an yellow phosphor having the formula a$[Sr_x(M1)_{1-x})]_z SiO_4 \cdot (1-a)[Sr_y(M2)_{1-y}]_u SiO_5:Eu^{2+}D$, in combination with a blue LED having the emission wave length about 450 nm.

Two-phase Hosphor Processing Methods

The present two-phase phosphor compositions are synthesized according to a combination of liquid-based sol-gel and co-precipitation methods. According to these methods, liquid-based solutions of silica and/or hydrolyzed silicon alkoxides in solution are combined with hydroxylated/carboxylated alkaline earth metal salt solutions to form a phosphor precursor suitable for subsequent calcining and sintering. Such methods are especially advantageous for incorporating halogen dopants into the crystal lattice of the phosphor.

Phosphor powders were traditionally synthesized by a so-called dry method called "firing," a reaction that takes place in the solid state. The term "firing" is used because solid state reactions typically require high-temperature processing (e.g., up to about 1400° C.) of metal atom precursor compounds mixed or blended in the desired atomic ratios. The starting materials in a firing process are typically the carbonates, nitrates, oxides, or hydroxides of the elements (metals or metalloids) that appear in final composition. Molar amounts are weighed according to the stoichiometric relationship desired in the final product, and then mixed by any one of a number of methods, including: 1) slurrying, wet ball-milling, dry ball-milling, or mortaring. The starting materials are then decomposed to yield the final product, the firing atmosphere varied according to the nature of the material and the desired reaction.

In a firing process the precursors generally remain in the solid state throughout the reaction, though on their way to becoming a crystalline product. Since the metal components are not particularly mobile in a solid phase, the firing methods subjects the precursor compounds to high temperatures to encourage atoms to property diffuse, become well mixed, and find their ordered atomic positions in the resulting crystalline structure.

A "flux" may be included in the reaction mixture prior to firing, the flux being typically a salt of a halide, included to facilitate crystallization and diffusion of the reactants during the solid state reaction. While not wishing to be bound to any particular theory, the present inventors believe that when flux compounds are used to facilitate diffusion and crystallization with solid state reaction methods, the halogen from the flux compound ends up predominantly within grain boundaries regions of the material, and not within the lattice of the crystal itself. Thus, the halogen from the flux compound is not readily available to contribute to the optical properties of the phosphor, which has been shown by the present inventors to be advantageous.

Liquid-based processes include sol-gel methods and co-precipitation techniques offer the advantages of intimate mixing of components at the atomic level in the liquid phase, and here it is possible for impurity dopant atoms to be substitutionally positioned on crystalline lattice lattice sites. Embodiments of the present innovation combine aspects of the sol-gel process and co-precipitation methods, utilizing the ability of each of these techniques to mix reactants of the phosphor batch at the atomic and/or molecular level. In one embodiment of the present invention, the alkaline earth metals may co-precipitate with silicon; that is to say, the alkaline earth metals may be functionalized as hydroxylated/carboxylated reactive monomers, such compounds then capable of reacting with at least partially hydrolyzed silicon alkoxide monomers. This embodiment of the present invention may be described as a co-polymerization between the silicon metalloid components and the alkaline earth metal components of the phosphor. Since the halogen dopant is also participating as a reactant in the liquid phase, it too is evenly dispersed in the reaction mixture, and substitutes for oxygen on anionic lattice sites within the crystal.

The synthesis of a phosphor using a sol-gel process is known in the art. The term "sol-gel" refers to a reaction mechanism whereby a sol, which is a collection of colloidal, solid particles suspended in a liquid, is transformed into a gel, which is a substance that contains a continuous solid skeleton having cells that enclose remnants of the liquid phase. The starting materials for the formation of a gel using the sol-gel process may include oxides of such elements as silicon, such as the compounds $Si(OCH_3)_4$, referred to as tetramethoxysilane (TMOS), and $Si(OC_2H_5)_4$, referred to as tetraethoxysilane (TEOS).

One method of forming a sol-gel matrix is through a series of hydrolysis and/or condensation reactions, by which a multi-functional monomer in the solution polymerizes into relatively large, highly branched materials. Once a molecule has been at least partially hydrolyzed, two silanol groups may then react (link together) in a condensation reaction to form an oligomer containing a siloxane bond (Si—O—Si). The condensation may release a water molecule or an alcohol molecule. Because the monomer has potentially four reactivesites, cross-linking may occur as a result of reactions occurring at side branches of the chain, contributing to a denser, more rigid solid network within the nascent gel. Continuing polymerization, and/or gelation, which is tantamount to saying an increase in the number of Si—O—Si siloxane bonds in the gel, produces a larger weight solid material via increased cross-linking.

Several steps may be performed after gelation prior to calcining and sintering, and these include aging and drying. Aging is defined in as a continuation of cross-linking reactions between oligomers and low-molecular weight polymers, and generalized strengthening of the polymeric network. The gels may be dried by a variety of techniques, including boiling a majority of the liquids off, the important parameters here being rate of evaporation, and atmospheric conditions. The rates of the three reactions described above, namely hydrolysis, water condensation, and alcohol condensation, are affected by a number of factors, including pH, time and temperature, reactant concentrations, the nature and concentration of a catalyst (if any), and the $H_2O$/Si molar ratio. By controlling these factors, it is possible to vary the microstructure of properties of the sol-gel derived network.

Precipitation of several different metal-containing compounds from solutions of their respective metal alkoxide precursors is in general referred to as a co-precipitation method. Co-precipitation methods of synthesizing crystalline inorganic solids involve dissolving metal salts in an aqueous solution, and precipiting all of the metals simultaneously such that no one type of metal segregates into clusters of its own kind. The co-precipitated metals, precipitated homogeneously, form a precursor to the ceramic metal oxide. Transition and alkaline earth metals are mixed in solution as complexes of their hydroxides, carboxylates (including oxalates), nitrates, and citrates, where these organic ligands serve to prevent one type of metal from precipitating separately from each of the other types of metals. After precipitating the mixed metal precursor solid, the organic (nitrate, oxalate, and hydroxylate) ligands are burned off at high temperatures, usually greater than about 200° C.

According to the present embodiments, it is contemplated that since each of the silicon-containing species and the alkaline earth containing species are in one form or another and at one time or another hydroxylated and/or carboxylated, the two types of species each comprise a form of a multifunctional monomer having reactive functional groups, and therefore metalloids such as silicon and true metals such as alkaline earth metals are capable of co-polymerizing, forming a gel network wherein silicon-oxygen-alkaline earth bonds are formed. It is this preservation of the homogeneity established in the liquid phase between the silicon-containing compounds and the alkaline earth containing compounds in a phosphor precursor that provides one of the advantages of the present embodiments.

The at least two phases of the present embodiments may be produced in a variety of ways. For example, the desired molar ratios of the starting metals and the metalloid(s) may be mixed together to provide the required two-phase (e.g., (M1)$_2$SiO$_4$ and (M2)$_3$SiO$_5$ green and/or orange phosphor) mix, wherein the two different phosphor phases are prepared simultaneously as early in the liquid sol-gel/co-precipitation state. Alternatively, the two phases (M1)$_2$SiO$_4$ and (M2)$_3$SiO$_5$ may be prepared separately in the mix, calcined separately, powderized, and sintered together. Alternatively, the two phases (M1)$_2$SiO$_4$ and (M2)$_3$SiO$_5$ may be precipitated, calcined, and sintered separately, and then mixed.

Methods of producing the present yellow phosphors include sol-gel methods, solid reaction methods, co-precipitation methods, and mixing methods. An exemplary co-precipitation method comprises:

a) dissolving Sr(NO$_3$)$_3$, (M1)(NO$_3$)$_2$ and (M2)(NO$_3$)$_2$ in water;

b) dissolving Eu$_2$O$_3$ in nitric acid;

c) dissolving SrF$_2$ in nitric acid;

d) mixing the resulting solutions of steps a), b), and c);

e) adding (CH$_3$O)$_4$Si to the resulting solution of step d), and then adding an acid to the mixture to cause precipitation;

f) adjusting the pH of the mixture of step e) to about 9;

g) drying the reaction product of step f), and then calcining the reaction product to decompose the precipitant; and h) sintering the precipitant of step g) in a reducing atmosphere.

Many modifications of the illustrative embodiments of the invention disclosed above will readily occur to those skilled in the art. Accordingly, the invention is to be construed as including all structure and methods that fall within the scope of the appended claims.

What is claimed is:

1. A two-phase yellow phosphor having a peak emission intensity at wavelengths ranging from about 555 nm to about 580 nm when excited by a radiation source having wavelengths ranging from 220 nm to 530 nm, wherein the phosphor contains at least a first phase with a crystal structure substantially the same as that of (M1)$_2$SiO$_4$ and a second phase with a crystal structure substantially the same as that of (M2)$_3$SiO$_5$, where M1 and M2 are each selected from the group consisting of Sr, Ba, Mg, Ca, and Zn.

2. A two-phase yellow phosphor having a peak emission intensity at wavelengths ranging from about 555 nm to about 580 nm when excited by a radiation source having wavelengths ranging from 220 nm to 530 nm, wherein the phosphor has the formula $$a[Sr_x(M1)_{1-x}]_2SiO_4 \cdot (1-a)[Sr_y(M2)_{1-y}]_uSiO_5:Eu^{2+}D;$$

M1 and M2 are at least one of a divalent metal selected from the group consisting of Ba, Mg, Ca, and Zn;

$0.6 \leq a \leq 0.85; 0.3 \leq x \leq 0.6; 0.85 \leq y \leq 1; 1.5 \leq z \leq 2.5; 2.6 \leq u \leq 3.3;$ Eu and D each range from about 0.001 to about 0.5;

D is at least one anion selected from the group consisting of F, Cl, Br, S, and N; and at least some of the D anion replaces oxygen in the silicate lattice of the phosphor.

3. The phosphor of claim 2, wherein M1 is selected from the group consisting of Ba and Mg, and M2 is Ba.

4. The phosphor of claim 2, wherein M1 is Ba, and M2 is selected from the group consisting of Ba and Mg.

5. A white LED comprising:
a radiation source configured to emit radiation having a wavelength greater than about 280 nm, and a two-phase yellow phosphor configured to absorb at least a portion of the radiation from the radiation source and emit light having a peak intensity at wavelengths ranging from about 555 nm to about 580 nm, wherein the phosphor has the formula $a[Sr_x(M1)_{1-x}]_zSiO_4 \cdot (1-a)[Sr_y(M2)_{1-y}]_uSiO_5:Eu^{2+}D;$ M1 and M2 are at least one of a divalent metal selected from the group consisting of Ba, Mg, Ca, and Zn;

$0.6 \leq a \leq 0.85;\ 0.3 \leq x \leq 0.6;\ 0.85 \leq y \leq 1;\ 1.5 \leq z \leq 2.5;$
$2.6 \leq u \leq 3.3;$ Eu and D each range from about 0.001 to about 0.5;
D is at least one anion selected from the group consisting of F, Cl, Br, S, and N; and
at least some of the D anion replaces oxygen in the silicate lattice of the phosphor.

6. The white LED of claim 5, further including a green phosphor configured to absorb at least a portion of the radiation from the radiation source, and emit light having a peak intensity at a wavelength greater than about 510 nm.

7. The white LED of claim 5, further including a blue phosphor configured to absorb at least a portion of the radiation from the radiation source, and emit light having a peak intensity at wavelengths ranging from about 420 to about 480 nm.

8. A yellow illumination system comprising:
a radiation source configured to emit radiation having a wavelength greater than about 280 nm, and a two-phase yellow phosphor configured to absorb at least a portion of the radiation from the radiation source and emit light having a peak intensity at wavelengths ranging from about 555 nm to about 580 nm, wherein the phosphor has the formula $a[Sr_x(M1)_{1-x}]_zSiO_4 \cdot (1-a)[Sr_y(M2)_{1-y}]_uSiO_5:Eu^{2+}D;$ M1 and M2 are at least one of a divalent metal selected from the group consisting of Ba, Mg, Ca, and Zn;

$0.6 \leq a \leq 0.85;\ 0.3 \leq x \leq 0.6;\ 0.85 \leq y \leq 1;\ 1.5 \leq z \leq 2.5;$
$2.6 \leq u \leq 3.3;$ Eu and D each range from about 0.001 to about 0.5;
D is at least one anion selected from the group consisting of F, Cl, Br, S, and N; and
at least some of the D anion replaces oxygen in the silicate lattice of the phosphor.

9. A color display panel comprising:
a radiation source configured to emit radiation having a wavelength greater than about 280 nm, and a two-phase yellow phosphor configured to absorb at least a portion of the radiation from the radiation source and emit light having a peak intensity at wavelengths ranging from about 555 nm to about 580 nm, wherein the phosphor has the formula $a[Sr_x(M1)_{1-x}]_zSiO_4 \cdot (1-a)[Sr_y(M2)_{1-y}]_uSiO_5:Eu^{2+}D;$ M1 and M2 are at least one of a divalent metal selected from the group consisting of Ba, Mg, Ca, and Zn;

$0.6 \leq a \leq 0.85;\ 0.3 \leq x \leq 0.6;\ 0.85 \leq y \leq 1;\ 1.5 \leq z \leq 2.5;$
$2.6 \leq u \leq 3.3;$ Eu and D each range from about 0.001 to about 0.5;
D is at least one anion selected from the group consisting of F, Cl, Br, S, and N; and
at least some of the D anion replaces oxygen in the silicate lattice of the phosphor.

10. A method of preparing a two phase silicate-based yellow phosphor having the formula $a[Sr_x(M1)_{1-x}]_zSiO_4 \cdot (1-a)[Sr_y(M2)_{1-y}]_uSiO_5:Eu^{2+}D;$ wherein
M1 and M2 are at least one of a divalent metal selected from the group consisting of Ba, Mg, Ca, and Zn;

$0.6 \leq a \leq 0.85;\ 0.3 \leq x \leq 0.6.\ 0.85 \leq y \leq 1;\ 1.5 \leq z \leq 2.5;$
$2.6 \leq u \leq 3.3;$ Eu and D each range from about 0.001 to about 0.5;
D is at least one anion selected from the group consisting of F, Cl, Br, S, and N; and
at least some of the D anion replaces oxygen in the silicate lattice of the phosphor;
the method selected from the group consisting of a sol-gel method, a solid reaction method, a co-precipitation, and a mixing method.

11. The method of claim 10, wherein the method is a co-precipitation method.

12. The method of claim 11, wherein the method comprises:
a) dissolving $Sr(NO_3)_3$, $(M1)(NO_3)_2$ and $(M2)(NO_3)_2$ in water;
b) dissolving $Eu_2O_3$ in nitric acid;
c) dissolving $SrF_2$ in nitric acid;
d) mixing the resulting solutions of steps a), b), and c);
e) adding $(CH_3O)_4Si$ to the resulting solution of step d), and then adding an acid to the mixture to cause precipitation;
f) adjusting the pH of the mixture of step e) to about 9;
g) drying the reaction product of step f), and then calcining the reaction product to decompose the precipitant; and
h) sintering the precipitant of step g) in a reducing atmosphere.

* * * * *

UNITED STATES PATENT AND TRADEMARK OFFICE
CERTIFICATE OF CORRECTION

PATENT NO. : 7,601,276 B2
APPLICATION NO. : 11/417690
DATED : October 13, 2009
INVENTOR(S) : Li et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 338 days.

Signed and Sealed this

Fifth Day of October, 2010

David J. Kappos
*Director of the United States Patent and Trademark Office*